(12) United States Patent
Kobayakawa

(10) Patent No.: US 8,148,746 B2
(45) Date of Patent: Apr. 3, 2012

(54) SEMICONDUCTOR LIGHT EMITTING DEVICE

(75) Inventor: Masahiko Kobayakawa, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 203 days.

(21) Appl. No.: 12/443,295

(22) PCT Filed: Sep. 27, 2007

(86) PCT No.: PCT/JP2007/068798
§ 371 (c)(1),
(2), (4) Date: Mar. 27, 2009

(87) PCT Pub. No.: WO2008/038708
PCT Pub. Date: Apr. 3, 2008

(65) Prior Publication Data
US 2010/0072496 A1 Mar. 25, 2010

(30) Foreign Application Priority Data
Sep. 29, 2006 (JP) .................................. 2006-267483

(51) Int. Cl.
*H01L 33/00* (2010.01)
*H01L 29/18* (2006.01)
(52) U.S. Cl. ................. 257/99; 257/88; 257/93; 257/98; 257/100; 257/E33.058; 257/E33.059; 257/E33.068; 257/E33.075
(58) Field of Classification Search .......................... None
See application file for complete search history.

(56) References Cited

U.S. PATENT DOCUMENTS

| | | | |
|---|---|---|---|
| 5,534,718 A * | 7/1996 | Chang | 257/98 |
| 2004/0056265 A1* | 3/2004 | Arndt et al. | 257/98 |
| 2004/0065894 A1* | 4/2004 | Hashimoto et al. | 257/100 |
| 2004/0256630 A1* | 12/2004 | Cao | 257/98 |
| 2005/0001225 A1* | 1/2005 | Yoshimura et al. | 257/98 |
| 2005/0029535 A1* | 2/2005 | Mazzochette et al. | 257/100 |
| 2006/0226437 A1* | 10/2006 | Fujita et al. | 257/98 |
| 2007/0153159 A1* | 7/2007 | Jung | 349/69 |
| 2008/0296590 A1* | 12/2008 | Ng | 257/88 |
| 2009/0267085 A1* | 10/2009 | Lee et al. | 257/88 |

FOREIGN PATENT DOCUMENTS

| | | |
|---|---|---|
| JP | 4-59167 | 5/1992 |
| JP | 11-237850 | 8/1999 |
| JP | 2000-082849 | 3/2000 |
| JP | 2006-210627 | 8/2006 |
| JP | 2006-253288 | 9/2006 |
| WO | WO 2006095949 A1 * | 9/2006 |

* cited by examiner

Primary Examiner — Hoang-Quan Ho
(74) Attorney, Agent, or Firm — Hamre, Schumann, Mueller & Larson, P.C.

(57) ABSTRACT

A semiconductor light emitting device (A1) includes a case (1) and a plurality of semiconductor light emitting elements (3) arranged in the case. The case (1) is formed with a plurality of reflectors (11) each in the form of a truncated cone surrounding a respective one of the semiconductor light emitting elements (3). Current is applied to each of the semiconductor light emitting elements (3) via two wires (6). Each of the wires (6) includes a first end, and a second end opposite to the first end. The first end is connected to the semiconductor light emitting element (3), whereas the second end is located outside the space surrounded by the reflector (11).

8 Claims, 14 Drawing Sheets

SEMICONDUCTOR LIGHT EMITTING DEVICE

TECHNICAL FIELD

The present invention relates to a semiconductor light emitting device including a plurality of semiconductor light emitting elements.

BACKGROUND ART

FIG. 15 shows an example of conventional semiconductor light emitting device (see e.g. Patent Document 1 identified below). The semiconductor light emitting device X shown in the figure includes a printed wiring board 91, a plurality of LED chips 92, a plurality of wires 93, a plurality of fluorescent resin members 94 and a transparent resin member 95. The LED chips 92 are mounted in a matrix on the printed wiring board 91. Each of the LED chips 92 is electrically connected to the wiring pattern (not shown) of the printed wiring board 91 via two wires 93. The printed wiring board 91 is formed with a plurality of reflectors 91a. Each of the reflectors 91a surrounds a respective one of the LED chips 92 and the two wires 93. The surfaces of the reflectors have a high reflectivity. The fluorescent resin members 94 fill the spaces surrounded by the reflectors 91a. The transparent resin member 95 covers the printed wiring board 91 and the fluorescent resin members 94. The transparent resin member 95 is formed with a plurality of lenses 95a. Each of the lenses 95a is located in front of a respective one of the LED chips 92. In the semiconductor light emitting device X, electric power is supplied to the LED chips 92 via terminals (not shown) provided on the printed wiring board 91. As a result, each of the LED chips 92 emits light, and the light passes through the lens 95a to travel to the outside.

Patent Document 1: JP-A-11-237850

The structure shown in FIG. 15 has the following drawbacks. In the semiconductor light emitting device X, each of the wires 93 is arranged in the space surrounded by the reflector 91a. The wire 93 blocks part of the light emitted from the LED chip 92, which hinders an increase in the brightness of the semiconductor light emitting device X. Further, the wire 93 is bonded to the wiring pattern of the printed wiring board 91 at a region surrounded by the reflector 91a. To achieve this structure, the shape and size of the reflector 91a needs to be determined taking the space for bonding the wire 93 into consideration. However, such a shape and size may lead to a reduction in the light reflection efficiency of the reflector 91a.

DISCLOSURE OF THE INVENTION

Problems to be Solved by the Invention

The present invention has been proposed under the circumstances described above. It is, therefore, an object of the present invention to provide a semiconductor light emitting device which is capable of increasing brightness.

According to the present invention, there is provided a semiconductor light emitting device including a plurality of semiconductor light emitting elements arranged on a plane, a plurality of reflectors each in the form of a truncated cone, each of the reflectors surrounding a respective one of the semiconductor light emitting elements, and a plurality of wires for applying current to the semiconductor light emitting elements. Each of the wires is provided with a first end connected to the semiconductor light emitting element and a second end opposite to the first end. The second end is located outside the space surrounded by the reflector. At least one wire is connected to each of the semiconductor light emitting elements.

In the above-described structure, one end and the nearby portion of each wire is located outside the space surrounded by the reflector. Thus, it is not necessary to provide a portion for bonding a wire in the space surrounded by the reflector. Thus, the blockage of the light emitted from the semiconductor light emitting elements by the wires is suppressed. Further, the shape and size of the reflectors can be arranged appropriately to cause the light from the semiconductor light emitting elements to be efficiently reflected for proper emission to the outside.

Preferably, the semiconductor light emitting device according to the present invention further includes at least one heat dissipater provided with a first surface on which the semiconductor light emitting elements are mounted and a second surface opposite to the first surface. The second surface of the heat dissipater is exposed to the outside of the semiconductor light emitting device. With this arrangement, the heat generated from the semiconductor light emitting elements is dissipated to the outside of the semiconductor light emitting device via the heat dissipater. This is advantageous for increasing the output of the semiconductor light emitting elements.

Preferably, the semiconductor light emitting device according to the present invention further includes two heat dissipaters spaced from each other so as to sandwich the center of the semiconductor light emitting device. Each of the heat dissipaters is provided with a first surface on which the semiconductor light emitting elements are mounted and a second surface opposite to the first surface. The second surface is exposed to the outside of the semiconductor light emitting device.

Preferably, each of the reflectors is provided with a shared edge and a non-shared edge. Each of the reflectors is partially in contact with the adjacent reflector at the shared edge. The height of the shared edge measured using the plane as the reference is lower than that of the non-shared edge.

Preferably, the semiconductor light emitting device according to the present invention further includes a resin for wavelength conversion loaded in the spaces surrounded by the reflectors. The resin for wavelength conversion extends over the shared edges of the reflectors.

Other features and advantages of the present invention will become more apparent from the detailed description given below with reference to the accompanying drawings.

BEST MODE FOR CARRYING OUT THE INVENTION

Preferred embodiments of the present invention will be described below with reference to the accompanying drawings.

Figure 2:
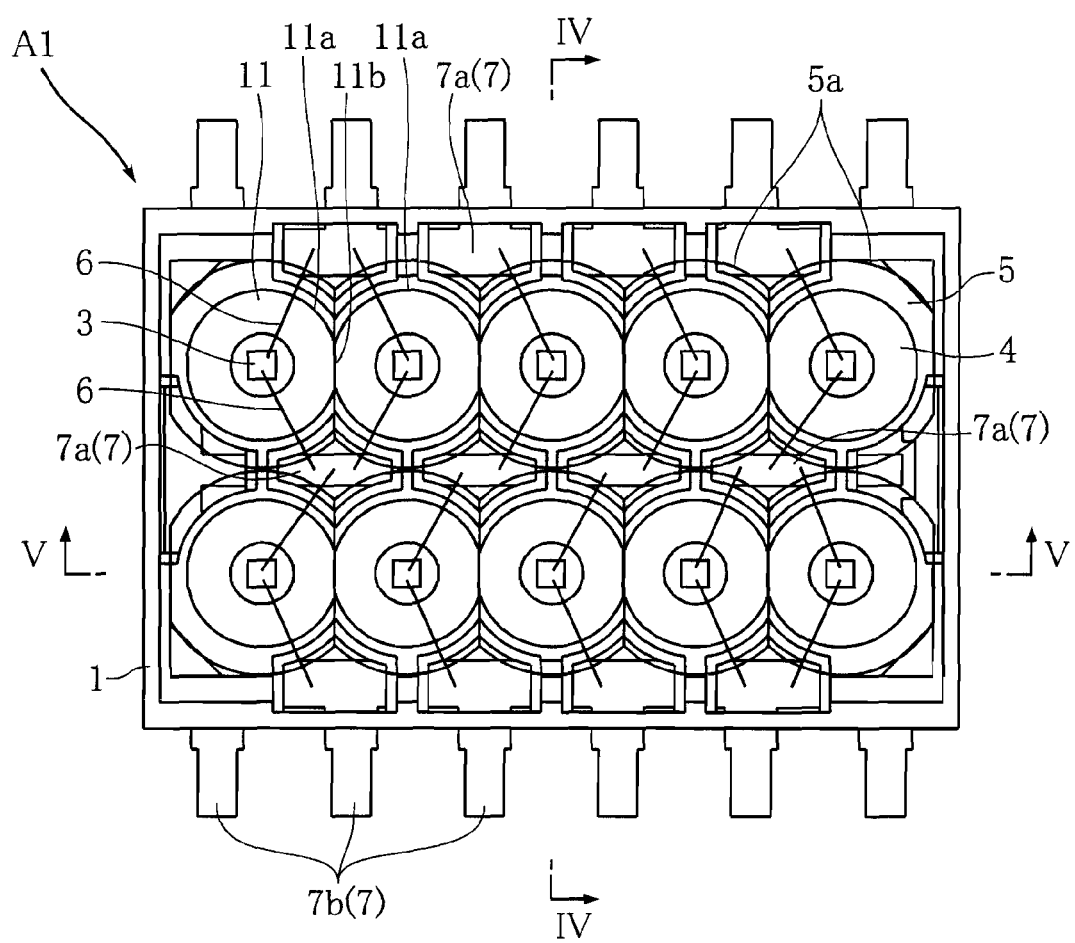
FIG. 2 is a plan view showing the semiconductor light emitting device of FIG. 1.
Figure 3:
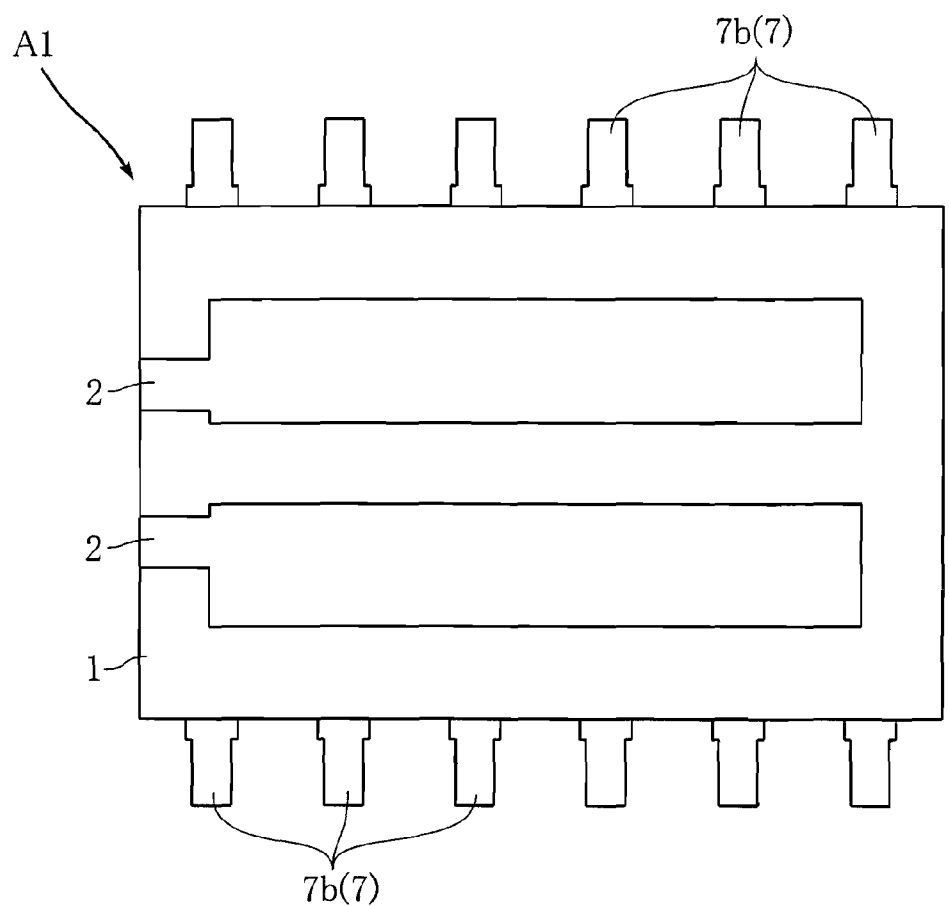
FIG. 3 is a bottom view showing the semiconductor light emitting device of FIG. 1.
Figure 4:
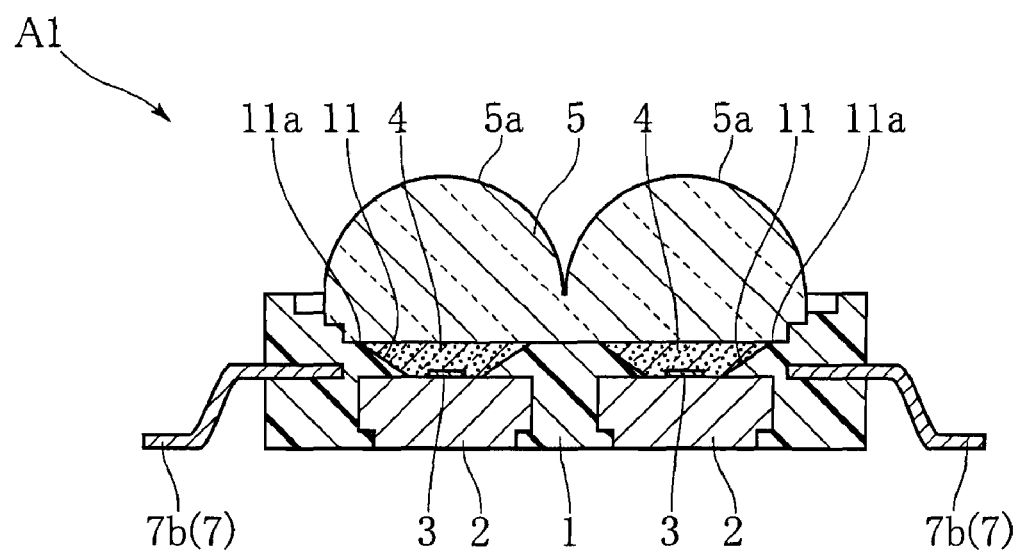
FIG. 4 is a sectional view taken along lines IV-IV in FIG. 2.
Figure 5:
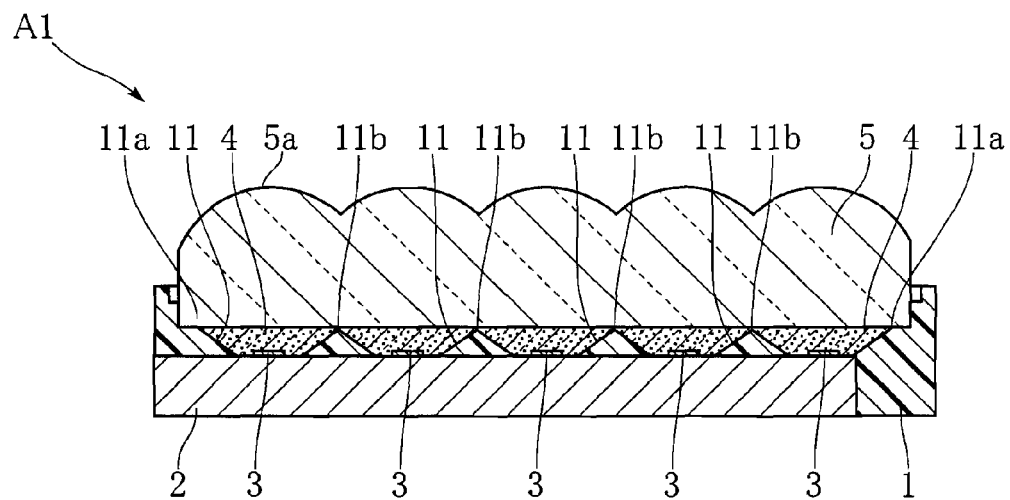
FIG. 5 is a sectional view taken along lines V-V in FIG. 2.
Figure 6:
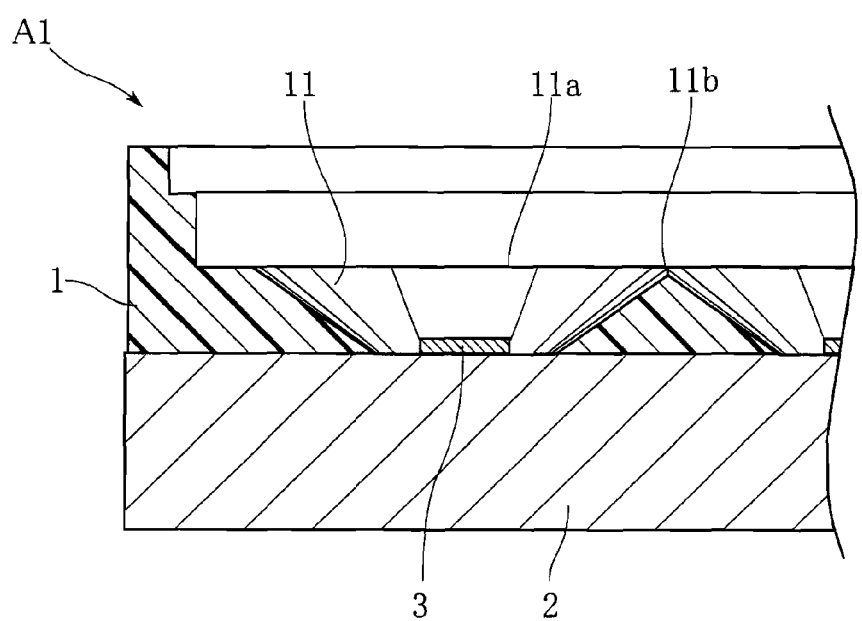
FIG. 6 is a sectional view showing a principal portion of the semiconductor light emitting device of FIG. 1.

FIGS. 1-6 show a semiconductor light emitting device according to a first embodiment of the present invention. The illustrated semiconductor light emitting device A1 includes a case 1, two heat dissipaters 2, a plurality of LED chips 3, fluorescent resin 4, transparent resin 5, a plurality of wires 6 and a plurality of leads 7. The semiconductor light emitting device A1 functions as a surface-emitting light source device by turning on the plurality of LED chips 3 simultaneously. In FIGS. 4-6, the illustration of the wires 6 is omitted. In FIG. 6, the illustration of the fluorescent resin 4 and the transparent resin 5 is also omitted.

The case 1 is generally in the form of a thin rectangular parallelepiped and made of e.g. white resin. The case 1 is used as the base of the semiconductor light emitting device A1. The case 1 is formed with a plurality of reflectors 11. Each of the reflectors 11 comprises a tapered surface defining a truncated cone and surrounds a respective one of the LED chips 3. The reflector 11 has a relatively high reflectivity and guides the light emitted from the LED chip 3 upward (toward the upper side in FIGS. 4 and 5). Adjacent ones of the reflectors 11 are partially in contact with each other (see FIG. 2). Specifically, each of the reflectors 11 includes two kinds of edges, i.e., a non-shared edge 11a and a shared edge 11b. Each of the reflectors 11 is in contact with the adjacent reflector 11 at the shared edge 11b. The non-shared edge 11a of each reflector 11 is not in contact with other reflectors 11. As shown in FIG. 6, the height of the shared edge 11b is lower than that of the non-shared edge 11a. For instance, these heights of the edges 11a, 11b may be measured utilizing the upper surface of the heat dissipaters 2 as the reference. Alternatively, the heights may be measured utilizing a hypothetical plane which is parallel to the upper surface of the heat dissipaters 2 as the reference.

The two heat dissipaters 2 are in the form of a bar made of e.g. Cu. The LED chips 3 are mounted on the heat dissipaters. The heat dissipaters 2 are embedded in the case 1 and spaced from each other in the width direction of the case 1 so as to sandwich the center of the semiconductor light emitting device A1, as shown in FIG. 3. In each of the heat dissipaters 2, both of the upper surface on which the LED chips 3 are mounted and the opposite lower surface are exposed to the outside of the case 1 (see FIG. 4).

The LED chips 3 function as the light source of the semiconductor light emitting device A1. However, as the light source, semiconductor light emitting elements other than LED chips may be employed. The size of each LED chip 3 may be about 0.3 mm×0.3 mm. By mounting the LED chips 3 on the two heat dissipaters 2, the LED chips 3 are arranged on a hypothetical plane in a matrix including two columns. The hypothetical plane may be utilized as the reference plane for measuring the heights of the edges of the reflectors 11.

The fluorescent resin 4 is a resin in which a fluorescent material is mixed. As shown in FIGS. 4 and 5, the fluorescent resin 4 fills the spaces surrounded by the reflectors 11. The fluorescent resin 4 appropriately converts the wavelength of the light emitted from the LED chips 3 depending on the kind of the fluorescent material. As shown in FIG. 5, the fluorescent resin 4 extends over the shared edges 11b of the reflectors 11. That is, the fluorescent resin 4 is not provided individually in each of the spaces surrounded by the reflectors 11 but provided as an integral part continuously filling all the spaces surrounded by the reflectors 11.

The transparent resin 5 is formed by e.g. molding using a transparent epoxy resin and covers the case 1 and the fluorescent resin 4. The transparent resin 5 is formed with a plurality of lenses 5a. Each of the lenses 5a is located in front of a respective one of the LED chips 3 and refracts the light emitted from the LED chip 3 to enhance the directivity.

The leads 7 are made of e.g. Cu and partially embedded in the case 1. Of each lead 7, the portions exposed at locations adjacent to the reflectors 11 provide pads 7a. The pads 7a are utilized for bonding the wires 6. In this embodiment, the pads 7a located between the two columns of the LED chips 3 serve as a cathode as the common electrode, whereas the pads 7a located on the outer side of the LED chips 3 serve as an anode as the individual electrodes. Of each lead 7, the portions extending out of the case 1 provide terminals 7b. The terminals 7b are utilized for the surface-mounting of the semiconductor light emitting device A1 on e.g. a circuit board. As better shown in FIG. 2, the pads 7a are surrounded by the reverse sides of the reflectors 11. Since each reflector 11 is in the form of a truncated cone, the reverse side of the reflector 11 has a curved configuration. Thus, each of the pads 7a is provided at the bottom of a relatively large space having a cross section substantially in the form of a rhombus or pentagon.

Figure 1:
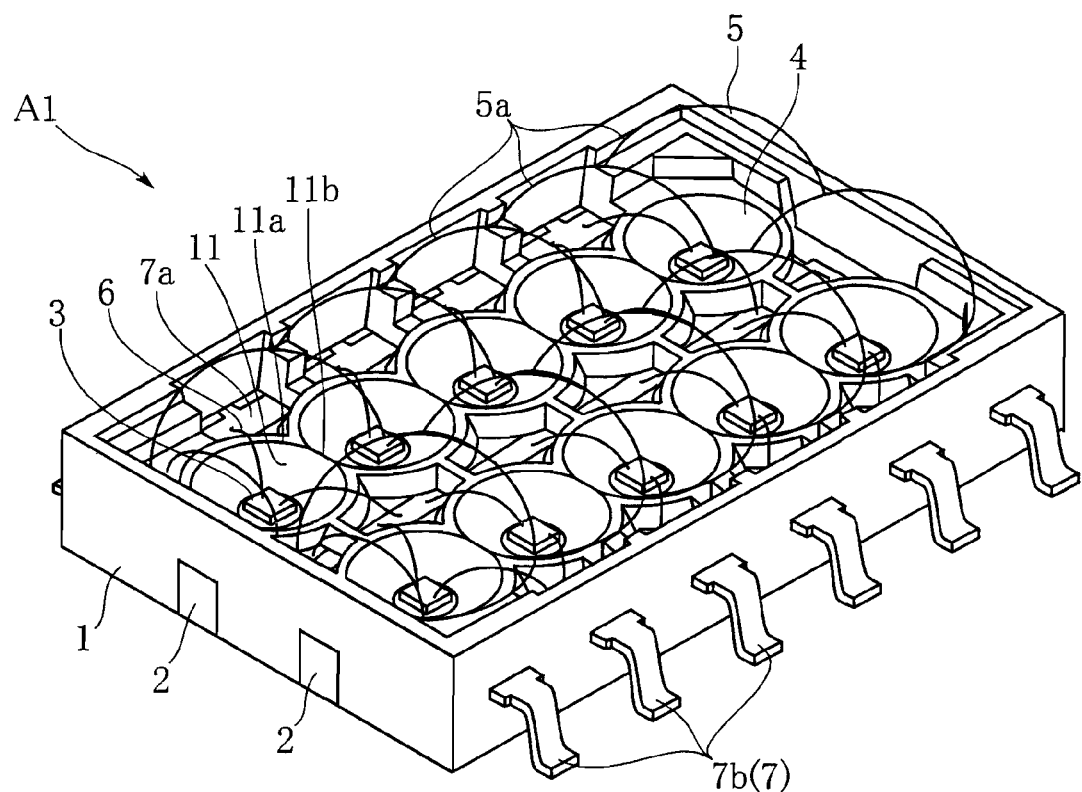
FIG. 1 is a perspective view showing a semiconductor light emitting device according to a first embodiment of the present invention.

The wires 6 are made of e.g. Au and used for applying current to the LED chips 3. As shown in FIGS. 1 and 2, two wires 6 are connected to each of the LED chips 3. As shown in FIG. 2, one of the two wires 6 is connected to a pad 7a located between the two columns of the LED chips 3. The other one of the two wires 6 is connected to a pad 7a located on the outer side of the LED chip 3.

The advantages of the semiconductor light emitting device A1 will be described below.

In the above-described structure, all the pads 7a to which the wires 6 are to be bonded are arranged outside the reflectors 11. That is, the portion for bonding a wire 6 extending from the LED chip 3 does not exist in the region surrounded by the reflector 11. Thus, the blockage of the light emitted from the LED chip 3 by the wire 6 is suppressed. For instance, the portion of each reflector 11 which is to come into contact with the heat dissipater 2 may be configured into a perfect circle close to the LED chip 3. In this way, the shape and size of the reflectors 11 can be arranged appropriately to cause the light from the LED chips 3 to be efficiently reflected toward the lenses 5a. By such arrangement, the brightness of the semiconductor light emitting device A1 is increased.

Both of the two heat dissipaters 2 are partially exposed to the outside of the case 2. With this arrangement, the heat generated due to the lighting of the LED chips 3 is properly dissipated to the outside of the semiconductor light emitting device A1. This makes it possible to increase the output from the LED chips 3, and hence, is advantageous for increasing the brightness of the semiconductor light emitting device A1.

For instance, to form the case 1 in the process of manufacturing the semiconductor light emitting device A1, the two heat dissipaters 2 are placed in a mold, and a white resin material is injected into the mold. Hardening of the resin material produces a force applied to the two heat dissipaters 2. However, since the two heat dissipaters 2 are spaced from each other so as to sandwich the center of the semiconductor light emitting device A1, the force is dispersed. Thus, the heat dissipaters 2 are prevented from cracking in the process of manufacturing the semiconductor light emitting device A1.

To provide the fluorescent resin 4, a resin material in a liquid state in which a fluorescent material is mixed is poured into the spaces surrounded by the reflectors 11. In this process, when the space surrounded by one reflector 11 is completely filled with the resin material, the resin material flows into the space surrounded by the adjacent reflector 11 by flowing over the shared edge 11b having a relatively low height. Thus, the resin material is uniformly poured into all the spaces surrounded by the reflectors 11 to such a degree that the liquid level of the resin material reaches the non-shared edges 11a. As a result, the light emitted from all the LED chips 3 is uniformly converted into the light of a desired wavelength.

The wires 6 are bonded to the pads 7a using e.g. a capillary. As noted before, each of the pads 7a is provided at the bottom of a relatively large space having a cross section substantially in the form of a rhombus or pentagon. Thus, the capillary does not come into contact with the portion of the case 1 which surrounds the pad 7a. Thus, the bonding of the wires 6 is facilitated.

Figure 7:
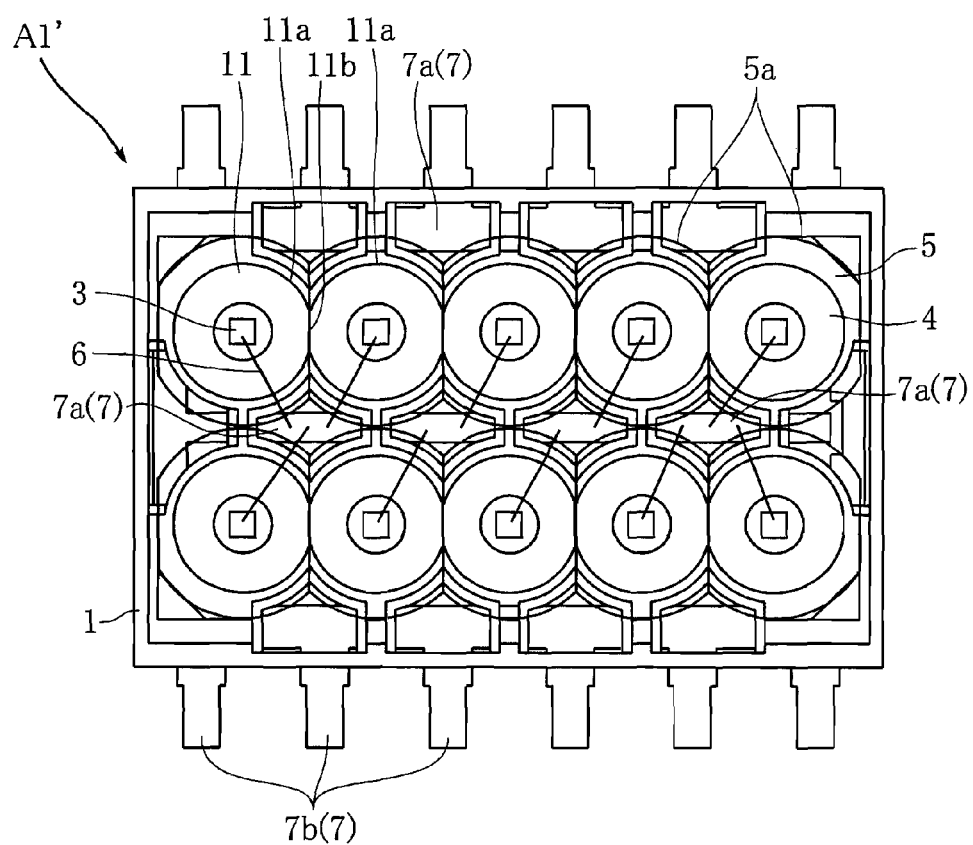
FIG. 7 is a plan view showing a variation of the semiconductor light emitting device of FIG. 1.

FIG. 7 is a plan view showing a variation of the semiconductor light emitting device A1. The structure of the semiconductor light emitting device A1' shown in this figure is substantially the same as that of the semiconductor light emitting device A1 except that only a single wire is bonded to each of the LED chips 3 (and the portions necessarily changed in accordance with this). For instance, in the example shown in FIG. 7, each of the LED chips 3 is connected to the power supply wiring at the bottom surface. This arrangement further reduces the degree to which the light emitted from the LED chip 3 is blocked by the wire.

Figure 8:
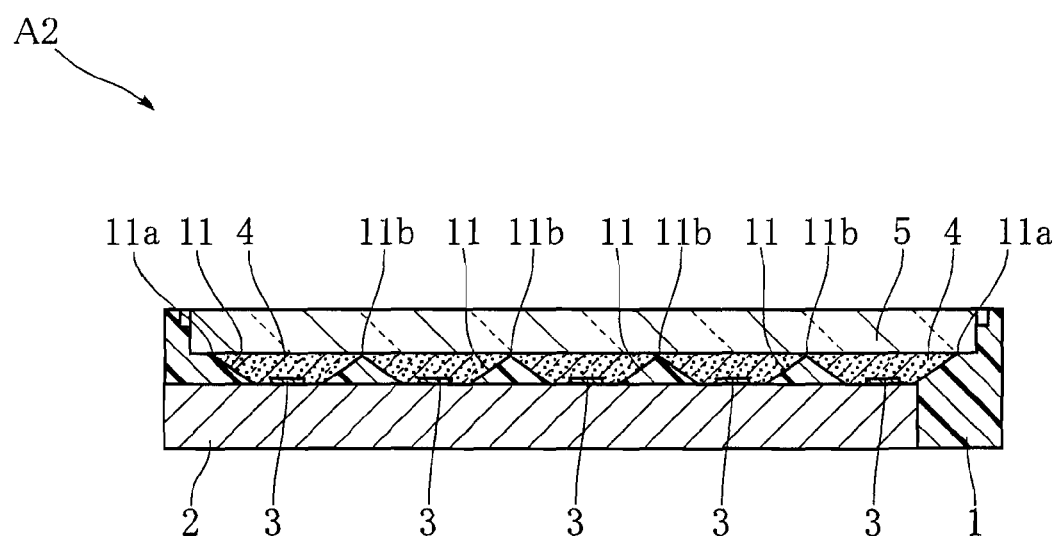
FIG. 8 is a sectional view showing a semiconductor light emitting device according to a second embodiment of the present invention.
Figure 10:
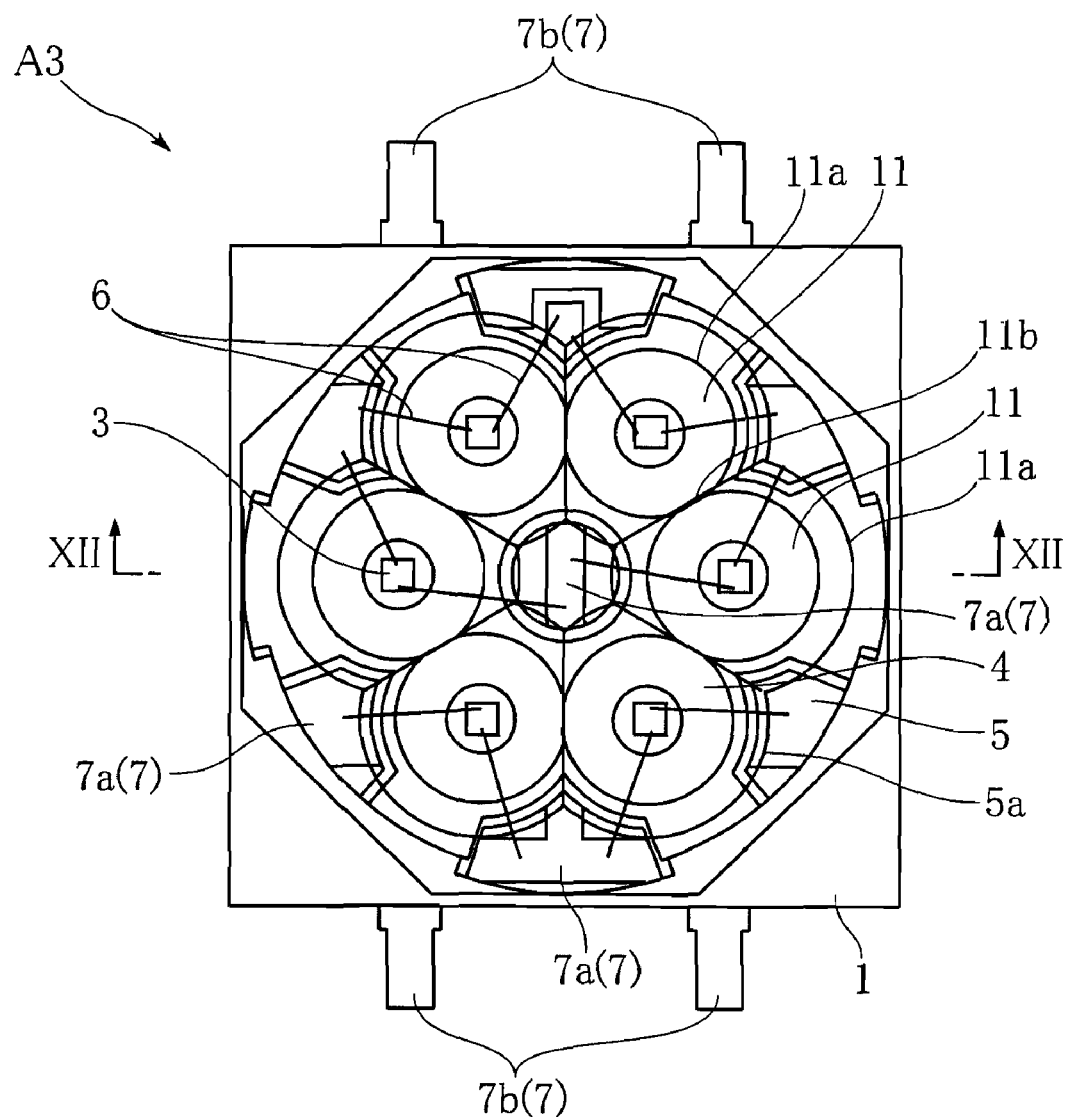
FIG. 10 is a plan view showing the semiconductor light emitting device of FIG. 9.
Figure 11:
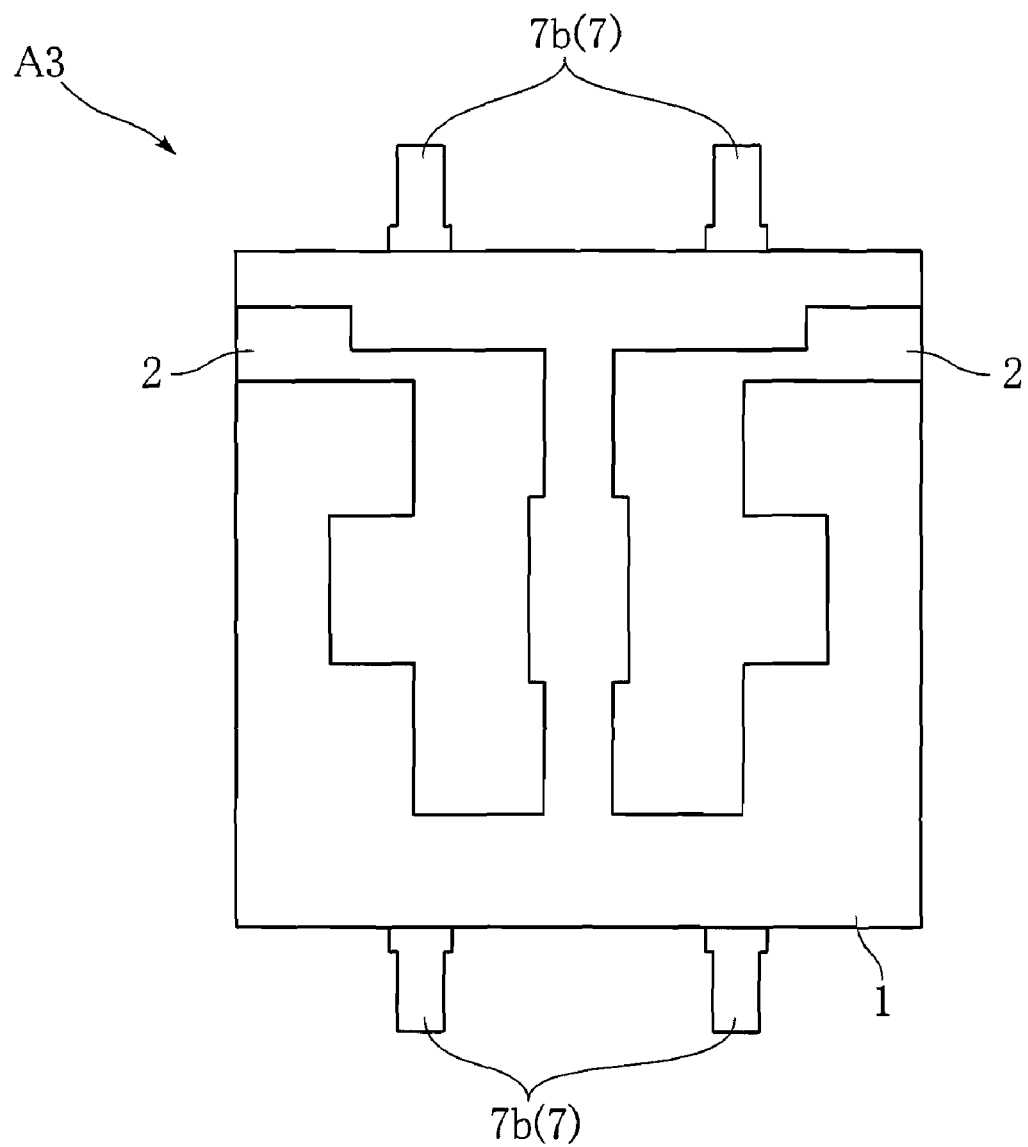
FIG. 11 is a bottom view showing the semiconductor light emitting device of FIG. 9.
Figure 12:
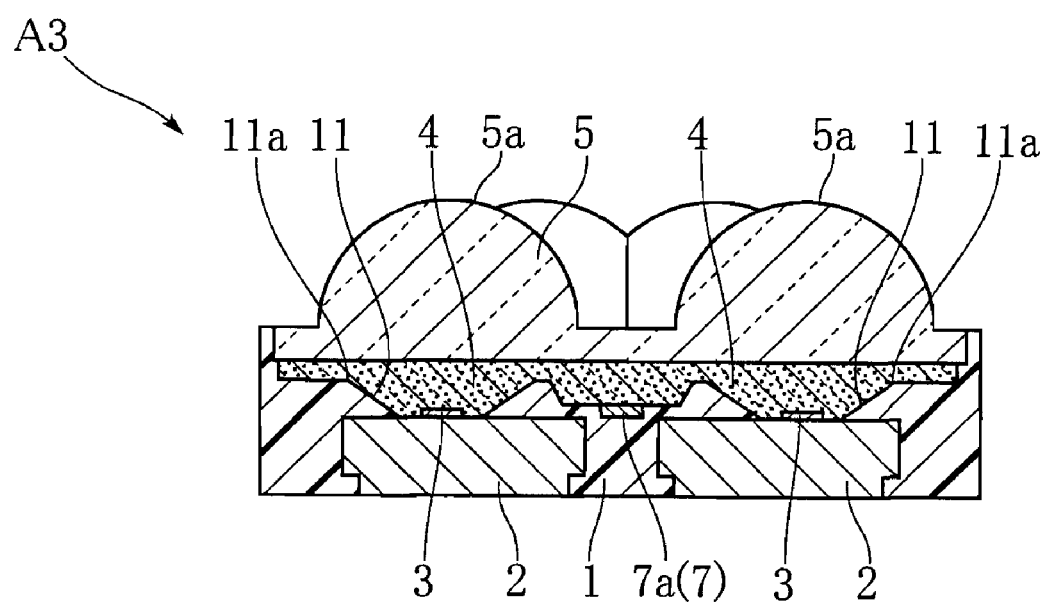
FIG. 12 is a sectional view taken along lines XII-XII in FIG. 10.
Figure 13:
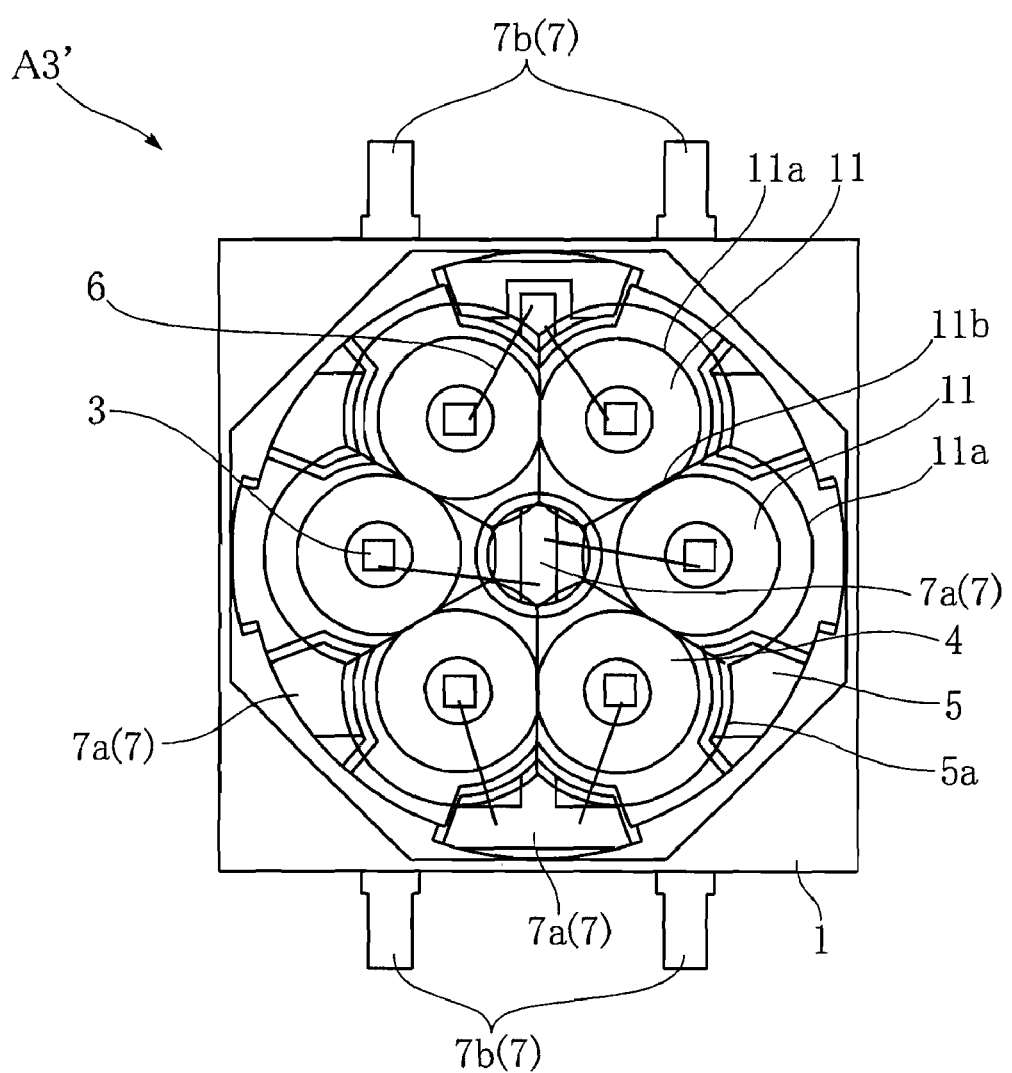
FIG. 13 is a plan view showing a variation of the semiconductor light emitting device of FIG. 9.
Figure 14:
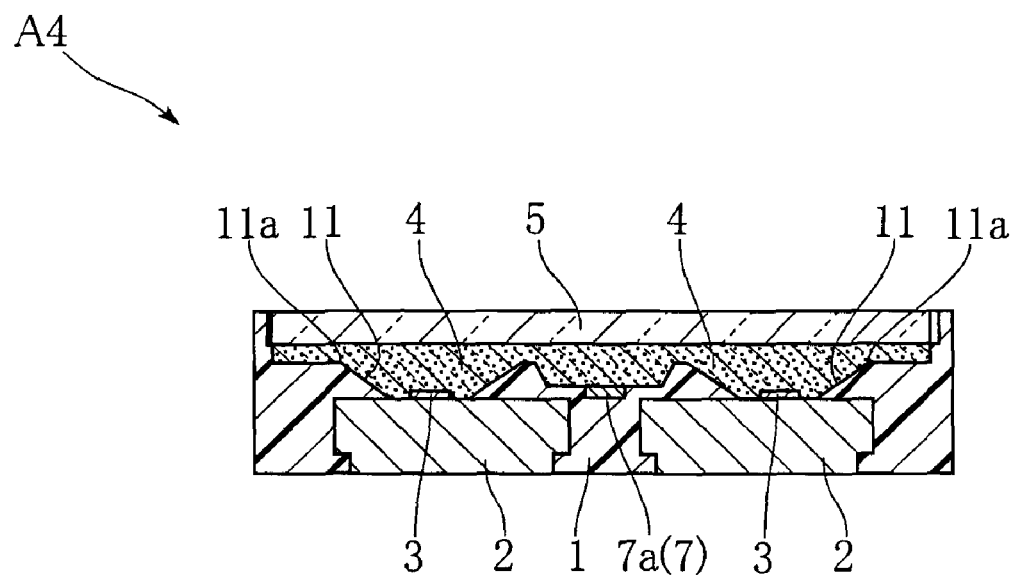
FIG. 14 is a sectional view showing a semiconductor light emitting device according to a fourth embodiment of the present invention.
Figure 15:
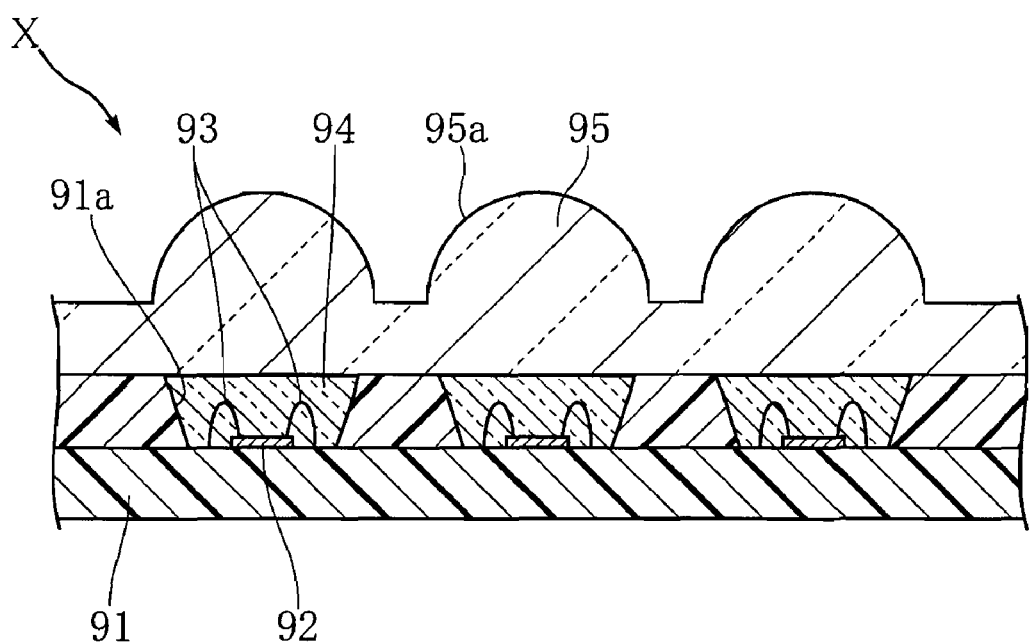
FIG. 15 is a sectional view showing an example of conventional semiconductor light emitting device.

FIGS. 8-14 show other embodiments of the present invention. In these figures, the elements which are identical or similar to those of the first embodiment are designated by the same reference signs as those used for the first embodiment. In FIGS. 8, 12 and 14, the illustration of wires 6 is omitted.

FIG. 8 shows a semiconductor light emitting device according to a second embodiment of the present invention. The illustrated semiconductor light emitting device A2 differs from that of the first embodiment in that the transparent resin 5 is not formed with the above-described lenses 5a. Similarly to the first embodiment, this arrangement also ensures increased brightness of the semiconductor light emitting device A2. Further, the thickness of the semiconductor light emitting device A2 can be made smaller than that of the semiconductor light emitting device A1.

Figure 9:
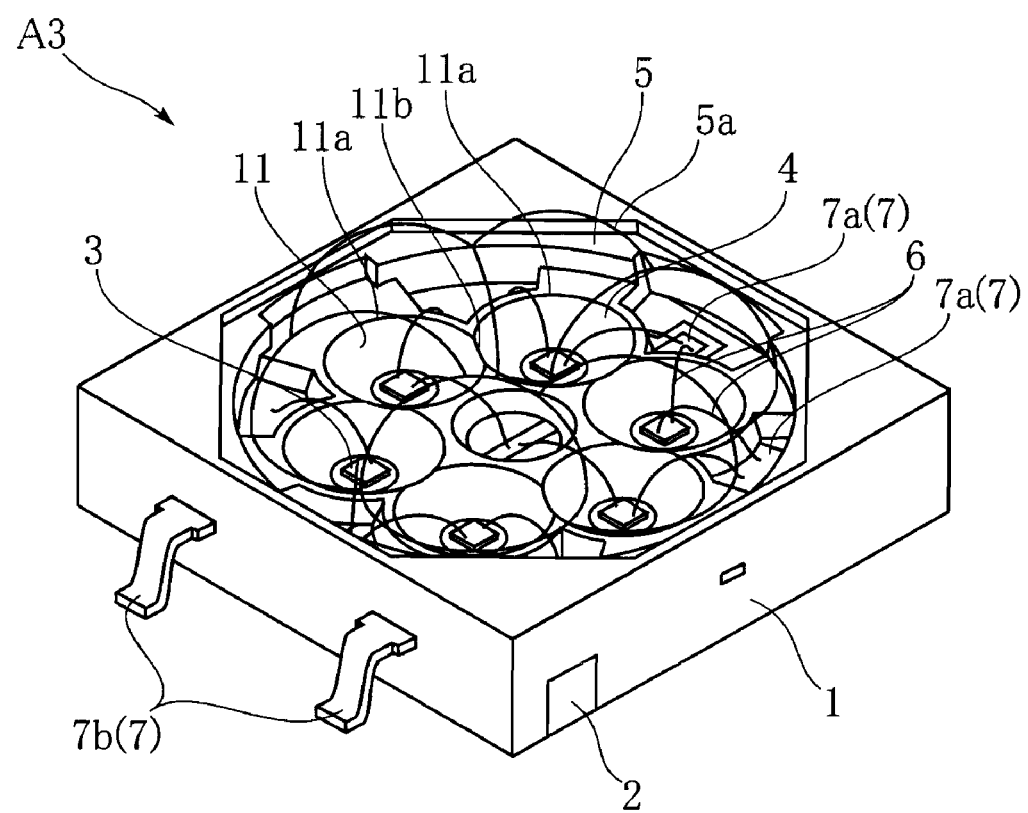
FIG. 9 is a perspective view showing a semiconductor light emitting device according to a third embodiment of the present invention.

FIGS. 9-12 show a semiconductor light emitting device according to a third embodiment of the present invention. The illustrated semiconductor light emitting device A3 differs from those of the first and the second embodiments in number and arrangement of the LED chips 3. As shown in FIGS. 9 and 10, the LED chips 3 are arranged on a circle. Further, the semiconductor light emitting device includes a pad 7a at a location surrounded by the LED chips 3. This pad 7a is used as a cathode as the common electrode. As shown in FIG. 11, the two heat dissipaters 2 are bent to correspond to the arrangement of the LED chips 3. Similarly to the first and the second embodiments, this arrangement also ensures increased brightness of the semiconductor light emitting device A3. Moreover, the pad 7a to serve as the cathode can be reduced in size, which leads to a size reduction of the semiconductor light emitting device A3.

FIG. 13 is a plan view showing a variation of the above-described semiconductor light emitting device A3. The structure of the semiconductor light emitting device A3' shown in this figure is substantially the same as that of the semiconductor light emitting device A3 except that only a single wire is bonded to each of the LED chips 3 (and the portions necessarily changed in accordance with this). For instance, in the example shown in FIG. 13, each of the LED chips 3 is connected to the power supply wiring at the bottom surface. This arrangement further reduces the degree to which the light emitted from the LED chip 3 is blocked by the wire.

FIG. 14 shows a semiconductor light emitting device according to a fourth embodiment of the present invention. Similarly to the third embodiment, the LED chips 3 of the illustrated semiconductor light emitting device A4 are arranged on a circle. However, the structure of this embodiment differs from that of the third embodiment in that the transparent resin 5 is not formed with the lenses 5a. The semiconductor light emitting device A5 having this structure also achieves an increase in brightness and a reduction in size and thickness.

The invention claimed is:

1. A semiconductor light emitting device comprising:
   a plurality of semiconductor light emitting elements arranged on a plane; and
   a plurality of reflectors each in form of a truncated cone, each of the reflectors surrounding a respective one of the semiconductor light emitting elements;
   wherein each of the reflectors is provided with a shared edge and a non-shared edge,
   wherein each of the reflectors is partially in contact with the adjacent reflector at the shared edge,
   wherein a height of the shared edge measured using the plane as a reference is lower than that of the non-shared edge, the shared edge being straight as viewed in a direction perpendicular to the plane,
   wherein the semiconductor light emitting device further comprises two heat dissipaters spaced from each other so as to sandwich a center of the semiconductor light emitting device, and
   wherein each of the heat dissipaters is provided with a first surface on which the semiconductor light emitting elements are mounted and a second surface opposite to the first surface, the second surface being exposed to the outside of the semiconductor light emitting device.

2. The semiconductor light emitting device according to claim 1, further comprising a resin for wavelength conversion loaded in the spaces surrounded by the reflectors, wherein the resin for wavelength conversion extends over the shared edges of the reflectors.

3. The semiconductor light emitting device according to claim 1, wherein only a single wire is connected to each of the semiconductor light emitting elements.

4. The semiconductor light emitting device according to claim 1, further comprising a plurality of wires for applying current to the semiconductor light emitting elements, wherein each of the wires is provided with a first end connected to one of the semiconductor light emitting elements and a second end opposite to the first end, the second end being located outside a space surrounded by the reflector surrounding said one of the semiconductor light emitting elements.

5. The semiconductor light emitting device according to claim 2, further comprising transparent resin provided on the resin for wavelength conversion.

6. The semiconductor light emitting device according to claim 2, further comprising transparent lens portions arranged on the resin for wavelength conversion, wherein the transparent lens portions correspond to the semiconductor light emitting elements, respectively.

7. The semiconductor light emitting device according to claim 1, wherein the semiconductor light emitting elements are arranged on a common circle.

8. The semiconductor light emitting device according to claim 7, further comprising a common electrode surrounded by the semiconductor light emitting elements.

* * * * *